United States Patent [19]

Quarton

[11] 4,209,710
[45] Jun. 24, 1980

[54] BATTERY BACK-UP REGULATOR

[75] Inventor: William T. Quarton, Englewood, Colo.

[73] Assignee: Honeywell Inc., Minneapolis, Minn.

[21] Appl. No.: 919,699

[22] Filed: Jun. 27, 1978

[51] Int. Cl.² .......................... H02J 9/06; H03K 1/14
[52] U.S. Cl. ...................................... 307/66; 307/297; 323/22 T
[58] Field of Search .................... 307/66, 86, 297, 150; 323/22 T, 15

[56] References Cited

U.S. PATENT DOCUMENTS

| | | | |
|---|---|---|---|
| 3,778,634 | 12/1973 | Hanrihan | 307/64 |
| 3,816,768 | 6/1974 | Stein | 307/296 |
| 3,912,940 | 10/1975 | Vince | 307/64 |
| 3,916,294 | 10/1975 | Kennedy | 307/297 |
| 3,979,610 | 9/1976 | Gordon | 307/297 |
| 4,065,676 | 12/1977 | Elias | 307/66 |

OTHER PUBLICATIONS

Micropower Voltage Detector-Design Spec. ICL8211, ICL8212, Intersil, pp. 63-72.

Primary Examiner—L. T. Hix
Assistant Examiner—S. D. Schreyer
Attorney, Agent, or Firm—Laurence J. Marhoefer; Lockwood D. Burton

[57] ABSTRACT

In an energization circuit for a memory module, the primary energization is derived from a primary power supply source fed through an isolating diode to a regulating circuit. The regulating circuit includes a series regulator device such as a darlington amplifier. A voltage detector module is provided which is characterized in very accurate operation while drawing a negligible amount of current for its own operation. The output of the voltage detector is used to control the operation of the series regulator. A stand-by, or back-up, power supply, which may be a battery is connected to the regulator circuit through a further isolating diode. The sensing circuit for the voltage detector module is so arranged that, when the primary power supply is operational, one level of output voltage for the regulator will be required to effect a controlled operation of the voltage detector; and when the back-up power supply is operational, a different voltage level output signal is required to effect a corresponding control of the voltage detector module.

6 Claims, 1 Drawing Figure

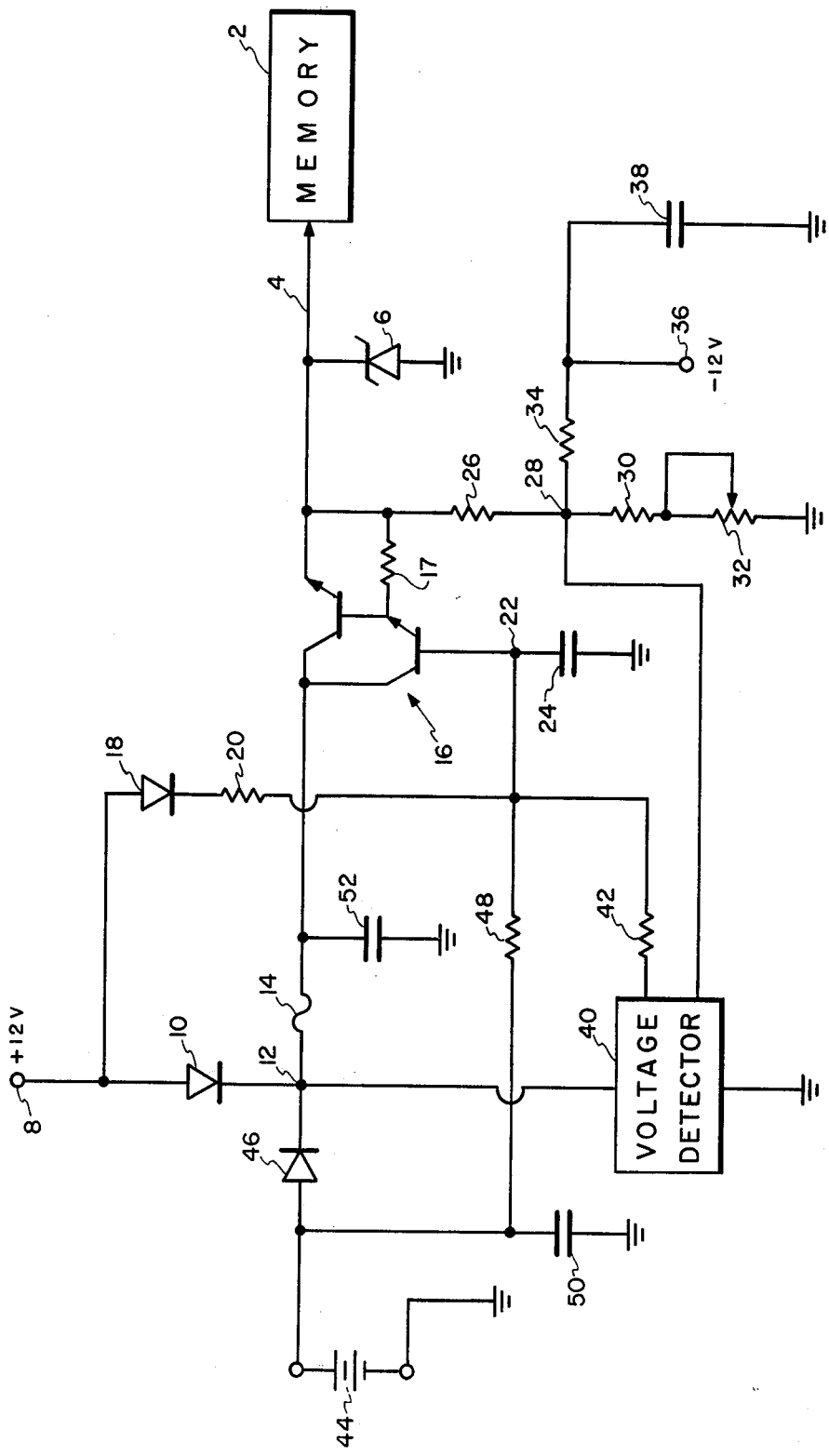

BATTERY BACK-UP REGULATOR

BACKGROUND OF THE INVENTION

The present invention relates to regulators. More particularly, it relates to a voltage regulator for the energization of a memory module.

In the modern computer art, there are provided memory modules wherein data is stored during the computational process. In certain types of these memory modules, the modules must be continuously energized in order to preserve the data stored therein. It is, therefore, usual that, in addition to the main operating power supply of the computer system, a back-up battery is provided to supply energizing current to the memory module whenever the main power supply fails. In the previously known systems, the transfer of energization from the main power supply to the back-up power supply has involved complex switching systems, complex control systems, or both. It is further noted that in a power-down situation, whenever the main power supply has failed, it is only desired to preserve the data stored in the memory and not to manipulate that data. Accordingly, it has been found that a lower energizing voltage is required to maintain the memory during power down condition than the voltage required when the data is to be manipulated.

SUMMARY OF THE INVENTION

It is, accordingly, an object of the present invention to provide an improved energization circuit.

It is another object of the present invention to provide an improved energization circuit which features controlled regulation at either of two predetermined output levels.

It is a further object of the present invention to provide an improved energization circuit for a memory module when the memory module is energized either from a main power supply or a back-up power supply.

In accomplishing these and other objects, there has been provided in accordance with the present invention, an improved energization circuit for a memory module wherein the primary energization is derived from a primary power supply source fed through an isolating diode to a regulating circuit. The regulating circuit includes a series regulator device such as a darlington amplifier. A voltage detector module is provided which is characterized in very accurate operation while drawing a negligible amount of current for its own operation. The output of the voltage detector is used to control the operation of the series regulator. A stand-by, or back-up, power supply, which may be a battery, is connected to the regulator circuit through a further isolating diode. The sensing circuit for the voltage detector module is so arranged that, when the primary power supply is operational, one level of output voltage for the regulator will be required to effect a controlled operation of the voltage detector; and when the back-up power supply is operational, a different voltage level output signal is required to effect a corresponding control of the voltage detector module.

BRIEF DESCRIPTION OF THE DRAWINGS

A better understanding of the present invention may be had from the following detailed description when read in the light of the accompanying drawing in which the single FIGURE is a schematic diagram of the regulator circuit embodying the present invention.

DETAILED DESCRIPTION

Referring to the single FIGURE in more detail, there is shown a memory unit 2 which is to be energized. The energization is supplied to the memory unit 2 over an output lead 4. Over voltage protection for the memory unit is provided by a zener diode 6 connected between the output lead 4 and ground. A main or primary power supply positive terminal 8 is arranged to be connected to a primary power supply source (not shown). The terminal 8 is connected through a diode 10 to a junction 12. The junction 12 is connected through a fuse 14 to the connector electrode of a darlington pair amplifier 16. The emitters of the darlington pair are connected to the output lead 4; the emitter of the lower transistor of the darlington pair being connected to the lead 4 through a resistor 17. The positive power supply terminal 8 is also connected through a diode 18 and a resistor 20 to a junction 22. The junction 22 is connected through a capacitor 24 to ground. The junction 22 is also connected to the base of the darlington amplifier 16. A voltage dividing network is connected between the output lead 4 and ground. The voltage dividing network includes a resistor 26 connected between the lead 4 and a junction 28. A fixed resistor 30 and a variable resistor 32 are serially connected between the junction 28 and ground. A resistor 34 is connected between the junction 28 and a negative terminal 36 of the primary power supply. A capacitor 38 is connected from the negative power supply terminal 36 to ground. The junction 28 is connected to a control input terminal of a voltage detector module 40. The voltage detector module 40, in an exemplary embodiment of the present invention, comprises a module identified as ICL8212 produced and distributed by Intersil Inc. The voltage detector 40 is energized by being connected between the junction 12 and ground. The output terminal of the voltage detector 40 is connected through a resistor 42 to the junction 22, thence to the base electrode of the darlington amplifier 16.

A secondary power supply is represented by a stand-by, or back-up, battery 44, the negative terminal of which is connected to ground. The positive terminal of the battery 44 is connected through a diode 46 to the junction 12. The positive terminal of the battery 44 is also connected through a resistor 48 to the junction 22. A filter capacitor 50 is connected between the positive terminal of the battery 44 and ground. A similar filter capacitor 52 is connected between one end of the fuse 14 and ground.

In operation, an exemplary memory module 2 requires an energization of 5 volts when it is fully operational, that is, when the primary power supply is applied and the computer system is in operation. On the other hand, when the primary power supply has, for some reason, failed, the memory module 2 requires approximately 3.3 volts in order to maintain undisturbed the memory content. The primary power supply across the terminals 8 and 36 is active, the diode 10 is forwardly biased while the diode 46 is back-biased, the voltage across the battery 44 being significantly less than the voltage from the primary power supply. Thus, the battery 44 is effectively isolated from the circuit. Current from the positive input terminal 8 is also applied through the diode 18 and the resistor 20 to the junction 22, thereby supplying base current for the darlington amplifier 16. The energization of the darlington 16 allows current from the diode 10 and junction 12 to flow through the fuse and the darlington amplifier to the output lead 4, thence through the resistor network including the resistors 26 and 34 to the return or negative power supply terminal 12, as well as through the resistors 30 and 32 to ground.

The voltage detector 40 is characterized in that a very low current is drawn by the voltage detector either through its energization or through its control input terminal. The voltage detector 40 is further characterized in that the output terminal is in the nature of an open-collector transistor which is rendered conductive to ground whenever the voltage at the control input terminal exceeds the threshold level of, for example, 1.1 volts. The voltage dividing network including the resistors 26, 30, 32 and 34 are such as to produce a 1.1 volt potential at the junction 28 whenever the voltage on the lead 4 is at the required level. Thus, when the primary power supply is in operation, current flows from the terminal 8 through the diode 10 to the junction 12 thence through the fuse 14, the regulating darlington amplifier 16, through the resistor 26, the resistor 34 to the negative power supply terminal 36. Also current flows from the junction 28 through the resistors 30 and 32 to ground. That current flowing through that voltage divider network produces a voltage level at the lead 4 at the higher or operational level required by the memory unit 2 which, in the exemplary embodiment, is 5 volts. If the voltage on that lead 4 tends to increase above the 5 volts, there will be a corresponding increase in the voltage at the junction 28, therefore, at the control input of the voltage detector 40. When the voltage at the input of the voltage detector 40 increases above the stated threshold voltage, the output terminal assumes a logical low or zero output. That condition causes current to flow from the junction 22 through the resistor 42 to ground thereby "stealing" base current from the darlington amplifier regulator 16. That, in turn, causes a corresponding reduction in the conduction of the regulating darlington amplifier 16 and effectively reducing the output voltage on the lead 4. The capacitor 24 serves as a smoothing capacitor for the changes in signal applied to the base of the darlington 16. Therefore, the voltage detector sensing the voltage at the junction 28 effectively maintains at a substantially constant value the output voltage on the lead 4.

When, for one reason or another, the primary power supply at the terminals 8 and 36 fails, the diode 46 becomes forwardly biased and the diode 10 becomes reverse biased as does the diode 18. Under those conditions, the energizing current feeding into the regulating darlington amplifier 16 is derived from the battery 44 and the primary power supply is effectively isolated from the circuit by the back-biased diodes 10 and 18, thereby preventing the flow of current from the battery into the primary power supply. The base current for the regulating darlington 16 is applied from the positive terminal of the battery 44 through the resistor 48 to the junction 22. When the primary power supply has failed, there is no current flow through the resistor 34 to the negative terminal 36. Inasmuch as the voltage at the terminal 28 must be maintained at the 1.1 threshold level for the input to the voltage detector, the same amount of current must flow through the resistors 30 and 32 as in the case when the primary power supply was operational. However, with no current flowing through the resistor 34, a reduced amount of current flows through the resistor 26 thereby reducing the voltage level at the output lead 4. The proper selection of the value of the resistors 26, 30, 32 and 34, the selected value of the voltage level appearing at the output lead 4 is controlled and programmed to the predetermined desirable levels. In the exemplary embodiment, for example, when the primary power supply has failed, the sustaining energization for the memory 2 derived from the battery 44 is set at 3.3 volts. Again, if the potential at the output lead 4 tends to increase above the established sustaining voltage of, for example, 3.3 volts, the potential at the junction 28 also tends to rise above the threshold level of the voltage detector again causing the voltage detector output terminal to be conductive to ground, thereby "stealing" base current from the junction 22, hence from the base of the darlington amplifier 16 reducing the conductivity thereof. Thus, when the memory module 2 is being energized from the backup or standby battery 44, the regulator darlington 16 is operative to maintain the output voltage at the desired 3.3 volts.

When the primary power supply has been restored, the energization of the memory is automatically transferred back to the primary power supply and the energization level is restored to the operational 5 volts. The restoration of the primary power supply causes the diodes 10 and 18 to be forwardly biased, back-biasing the diode 46, thereby removing the back-up battery from the energization circuit. At the same time, the restoration of the primary power supply again establishes the negative 12 volts at the terminal 36, causing current again to flow through the resistor 34, thereby increasing the current flow through the resistor 26. The increased current flow through the resistor 26 restores the reference level at the output lead 4 to the operational 5 volts. All of this is accomplished without the need for changing the threshold level for the signal input to the voltage detector. The zener diode 6 is connected to protect the memory module 2 from an inadvertent overvoltage such as would be incident to a failure of the regulating darlington 16 or an improper choice or setting of the resistors 30 or 32. If such an overvoltage occurs, the zener diode becomes conductive thereby blowing a fuse 14.

Thus there has been provided, in accordance with the present invention, an improved regulator circuit for regulating an output voltage at either of two predetermined voltage levels, with an automatic transfer from one voltage level to the other without the use of switching devices or switch control circuits.

The embodiments of the invention in which an exclusive property or privilege is claimed are defined as follows:

1. A voltage regulator circuit comprising:
    a primary source of voltage to be regulated,
    a back-up source of voltage to be regulated,
    said primary source and said back-up source being connected to a common junction through mutual isolation means,
    a regulator output terminal,
    a series connected regulating means connected between said common junction and said regulator output terminal,
    an output voltage sensing circuit connected to said regulator output terminal, said output voltage sensing circuit including a voltage detector module having an input terminal and output terminal and characterized in having a negligible current drain, said voltage detector module being further characterized in having a predetermined threshold voltage characteristic at said module input terminal at which threshold voltage the signal condition at said module output terminal changes between a conductive and nonconductive state, said output voltage sensing circuit also including a voltage dividing network connected to said regulator output terminal and having an intermediate connection to said input terminal of said module, said voltage dividing network being characterized in providing at said intermediate connection a signal voltage substantially equal to said threshold voltage for a first voltage level at said regulator output terminal whenever said primary source is operatively connected to said common junction and a signal voltage substantially equal to said threshold voltage for a second and different voltage level at said regulator output terminal whenever said back-up source is operatively connected to said common junction, and means connecting said module output terminal to control said regulating means in response to changes in said voltage at said regulator output terminal.

2. The voltage regulator circuit as set forth in claim 1 wherein said mutual isolation means comprises a first diode connected between said primary source and said common junction and a second diode connected between said back-up source and said common junction, said second diode being back-biased whenever said primary source is operational, and said first diode being back-biased whenever said primary source falls below the voltage level of said back-up source.

3. A voltage regulator circuit comprising:
a primary source of voltage to be regulated,
a back-up source of voltage to be regulated,
said primary source and said back-up source being connected to a common junction through mutual isolation means comprising a first diode connected between said primary source and said common junction and a second diode connected between said back-up source and said common junction, said second diode being back-biased whenever said primary source is operational, and said first diode being back-biased whenever said primary source falls below the voltage level of said back-up source,
a regulator output terminal,
a series connected regulating means connected between said common junction and said regulator output terminal,
an output voltage sensing circuit connected to said regulator output terminal, said output voltage sensing circuit including a voltage detector module having an input terminal and output terminal and characterized in having a negligible current drain, said voltage detector module being further characterized at said module input terminal at which threshold voltage the signal condition at said module output terminal changes state, said output voltage sensing circuit also including a voltage dividing network connected to said regulator output terminal and having an intermediate connection to said input terminal of said module, said voltage dividing network being characterized in providing at said intermediate connection a signal voltage substantially equal to said threshold voltage for a first voltage level at said regulator output terminal whenever said primary source is operatively connected to said common junction and a signal voltage substantially equal to said threshold voltage for a second and different voltage level at said regulator output terminal whenever said back-up source is operatively connected to said common junction,
said voltage divider network including a first resistive leg connected between said regulator output terminal and said intermediate connection, a second resistive leg connected between said intermediate connection and ground, and a third resistive leg connected between said intermediate connection and a negative potential return path for said primary source, said third leg being operatively in the network whenever said primary source is operative, and
means connecting said module output terminal to control siad regulating means in response to changes said voltage at said regulator output terminal.

4. The voltage regulator circuit as set forth in claim 3 wherein said means connecting said module output terminal to control said regulating means includes a signal smoothing capacitor.

5. The voltage regulator circuit as set forth in claim 4 wherein said series connected regulating means comprises a darlington transistor amplifier, said means connecting said module output terminal to control said regulating means includes a connection the base input of said darlington amplifier.

6. A voltage regulator circuit comprising:
a primary source of voltage to be regulated,
a back-up source of voltage to be regulated,
said primary source being connected to a common junction through a first isolating diode, said back-up source being connected to said common junction through a second isolating diode said second diode being back-biased by said primary source whenever said primary source is operative, said first isolating diode being back-biased whenever said primary source voltage falls below the level of said back-up source,
a regulator output terminal;
a series connected regulating means comprising a darlington transistor amplifier having its collector-emitter path connected between said common junction and said regulator output terminal;
an output voltage sensing circuit connected to said regulator output terminal, said output voltage sensing circuit including a voltage detector module having an input terminal and an output terminal and characterized in having a negligible current drain, said voltage detector module being further characterized in having a predetermined threshold voltage characteristic at said module input terminal at which threshold voltage the signal condition at said module output terminal changes state, said output voltage sensing circuit also including a voltage dividing network connected to said regulator output terminal and having an intermediate connection to said module input terminal, said voltage divider network including a first resistive leg connected between said regulator output terminal and said intermediate connection, a second resistive leg connected between said intermediate connection and ground, and a third resistive leg connected between said intermediate connection and a negative potential return path for said primary source, said third leg being operatively in the network whenever said primary source is operative, said voltage dividing network being characterized in providing at said intermediate connection a signal voltage substantially equal to said threshold voltage for a first voltage level at said regulator output terminal whenever said primary source is operatively connected to said common junction, and a signal voltage substantially equal to said threshold voltage for a second and different voltage level at said regulator output terminal, and means including a signal smoothing capacitor connecting said module output terminal to the base control input of said darlington amplifier.

* * * * *